(12) United States Patent
Taskar et al.

(10) Patent No.: US 11,532,460 B2
(45) Date of Patent: Dec. 20, 2022

(54) GAS MIXER

(71) Applicant: Lam Research Corporation, Fremont, CA (US)

(72) Inventors: Mark Taskar, San Mateo, CA (US); Iqbal A. Shareef, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 136 days.

(21) Appl. No.: 17/165,923

(22) Filed: Feb. 2, 2021

(65) Prior Publication Data
US 2021/0183626 A1 Jun. 17, 2021

Related U.S. Application Data

(63) Continuation of application No. 16/040,326, filed on Jul. 19, 2018, now Pat. No. 10,943,769.

(51) Int. Cl.
*H01J 37/32* (2006.01)
*F16K 11/10* (2006.01)

(52) U.S. Cl.
CPC .. *H01J 37/32449* (2013.01); *H01J 37/32935* (2013.01); *F16K 11/10* (2013.01)

(58) Field of Classification Search
CPC .......................... H01J 37/32449; F16K 11/10
See application file for complete search history.

(56) References Cited

U.S. PATENT DOCUMENTS

| | | | |
|---|---|---|---|
| 7,335,396 B2 ‡ | 2/2008 | Carpenter | C23C 16/45525 118/692 |
| 2009/0272492 A1 ‡ | 11/2009 | Katz et al. | H01J 37/3244 156/34 |
| 2011/0315320 A1 ‡ | 12/2011 | Do et al. | C23C 16/45565 156/34 |
| 2012/0137703 A1 ‡ | 6/2012 | Desai | F23R 3/14 60/782 |

(Continued)

FOREIGN PATENT DOCUMENTS

| | | |
|---|---|---|
| CN | 112437976 | 3/2021 |
| WO | WO-2020018850 A1 | 1/2020 |

OTHER PUBLICATIONS

U.S. Appl. No. 16/040,326, Advisory Action dated Aug. 31, 2020, 3 pgs.
U.S. Appl. No. 16/040,326, Final Office Action dated Jun. 1, 2020, 25 pgs.
U.S. Appl. No. 16/040,326, Non Final Office Action dated Jan. 3, 2020, 21 pgs.

(Continued)

*Primary Examiner* — Kevin R Barss
(74) *Attorney, Agent, or Firm* — Schwegman Lundberg & Woessner, P.A.

(57) ABSTRACT

In some examples, a gas mixer comprises a body and an orbital array of gas inlets for receiving one or more constituents of a mixed gas. A mixed gas outlet emits a mixed gas from the body and is disposed at a center of the orbital array of gas inlets. A central gas mixing point, separate from the mixed gas outlet, comprises an internal volume disposed within the body and is surrounded by the orbital array of gas inlet. The internal volume is in fluid communication with the orbital array of gas inlets via a corresponding array of gas (Continued)

pathways extending from the internal volume to each of the gas inlets. Each gas path length of the respective gas pathways is the same. Control circuitry is configured to control gas flow rate within each of the gas pathways individually.

20 Claims, 12 Drawing Sheets

(56) References Cited

U.S. PATENT DOCUMENTS

| | | | |
|---|---|---|---|
| 2014/0174362 A1 ‡ | 6/2014 | Kao et al. | C23C 16/45536 118/72 |
| 2014/0224175 A1 ‡ | 8/2014 | Abedijaberi | C23C 16/4401 118/71 |
| 2014/0329189 A1 ‡ | 11/2014 | McClain | F23G 7/085 431/202 |
| 2015/0267299 A1 ‡ | 9/2015 | Hawkins et al. | C23C 16/45523 427/25 |
| 2018/0141018 A1 ‡ | 5/2018 | Igci | B01J 8/22 |
| 2020/0027702 A1 | 1/2020 | Taskar et al. | |

OTHER PUBLICATIONS

U.S. Appl. No. 16/040,326, Notice of Allowance dated Nov. 2, 2020, 7 pgs.
U.S. Appl. No. 16/040,326, Response filed Mar. 12, 2020 to Non Final Office Action dated Jan. 3, 2020, 11 pgs.
U.S. Appl. No. 16/040,326, Response filed Jul. 29, 2020 to Final Office Action dated Jun. 1, 2020, 10 pgs.
U.S. Appl. No. 16/040,326, Response filed Sep. 1, 2020 to Final Office Action dated Jun. 1, 2020 and Advisory Action dated Aug. 31, 2020, 10 pgs.
U.S. Appl. No. 16/040,326, Response filed Oct. 31, 2019 to Restriction Requirement dated Sep. 12, 2019, 6 pgs.
U.S. Appl. No. 16/040,326, Restriction Requirement dated Sep. 12, 2019, 5 pgs.
International Application Serial No. PCT/US2019/042490, International Preliminary Report on Patentability dated Jan. 28, 2021, 8 pgs.
International Application Serial No. PCT/US2019/042490, International Search Report dated Nov. 6, 2019, 3 pgs.
International Application Serial No. PCT/US2019/042490, Written Opinion dated Nov. 6, 2019, 6 pgs.

‡ imported from a related application

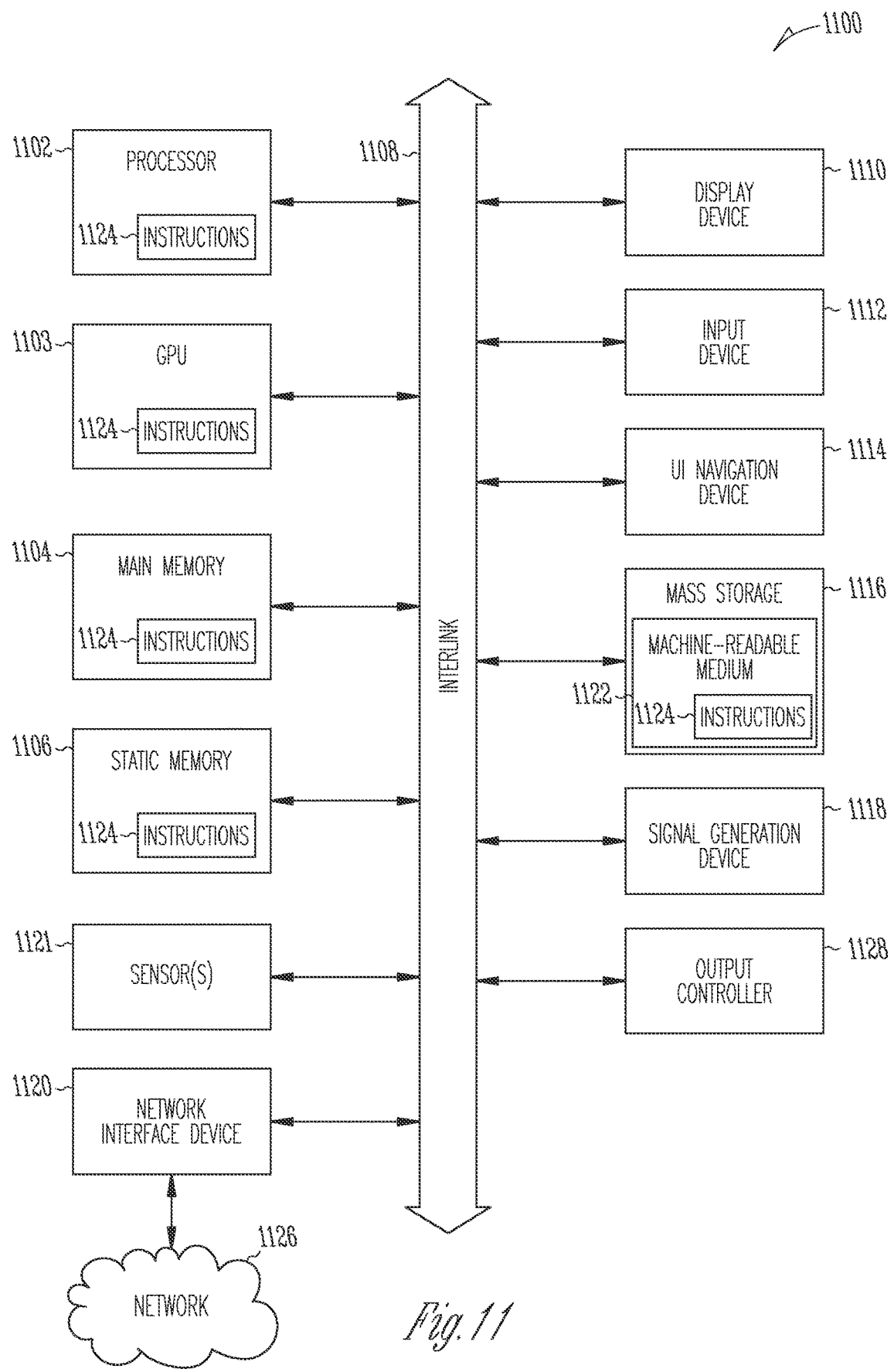

GAS MIXER

CLAIM OF PRIORITY

This application is a continuation of and claims the benefit of priority under 35 U.S.C. § 120 to U.S. patent application Ser. No. 16/040,326, filed on Jul. 19, 2018, which is incorporated by reference herein in its entirety.

FIELD

The present disclosure relates generally to a gas distributor and flow verifier, and in one example to an orbital gas distributor or splitter having an orbital array of gas outlets, nozzles, or orifices arranged around a central gas distribution point.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A typical plasma etching apparatus comprises a reactor in which there is a chamber through which reactive gas or gases flow. In semiconductor processing, the etch or deposition rate uniformity across the wafer during each process directly affects the device yield. Uniformity has become one of the main qualifying requirements for a process reactor and hence is considered a very important parameter during its design and development.

In a plasma etch reactor, the uniformity of etch parameters (such as etch rate, profile, cross dimension, and so forth) can be affected by several parameters. One of these parameters is the content and delivery of constituents of the plasma gas. Maintaining uniform gas mixing and distribution with improved transient response while providing consistent plasma discharge and chemistry above the wafer, has become increasingly important for improving uniformity.

SUMMARY

In some examples, a gas distributor comprises a body, a gas inlet for admitting gas to the body, an orbital array of gas outlets for distributing the gas to an external component, and a central gas distribution point disposed within the body at a center of the orbital array of gas outlets and in fluid communication with the orbital array of gas outlets.

In some examples, the orbital array of gas outlets are radially spaced equidistantly around the central gas distribution point. In some examples, the body includes internal gas conduits connecting the central gas distribution point to the orbital array of gas outlets. In some examples, respective gas flow paths of the internal gas conduits from the central gas distribution point to the orbital array of gas outlets are equal in length. In some examples, each gas outlet includes an orifice sized to permit or regulate a predetermined flow of gas going through that gas outlet. In some examples, the body includes mounting locations for respective control valves or nozzles to permit or regulate predetermined flows of gas exiting the gas outlets. In some examples, each of the control valves or nozzles includes an orifice.

In some examples, the gas distributor further comprises the control valves or nozzles. In some examples, the control valves or nozzles are replaceable. In some examples, the control valves or nozzles are configured in a horizontal orientation or a vertical orientation. In some examples, an orifice associated with a first control valve or nozzle is sized differently from an orifice associated with a second control valve or nozzle. In some examples, the central gas distribution point includes a volume of substantially spherical shape. In some examples, one or more manometers measure or verify gas flow of the gas flowing through the orbital array of gas outlets.

DESCRIPTION OF THE DRAWINGS

Some embodiments are illustrated by way of example and not limitation in the views of the accompanying drawings:

FIG. 11 is a block diagram illustrating an example of a machine by which one or more example method embodiments may be implemented or controlled.

DESCRIPTION

Figure 1:
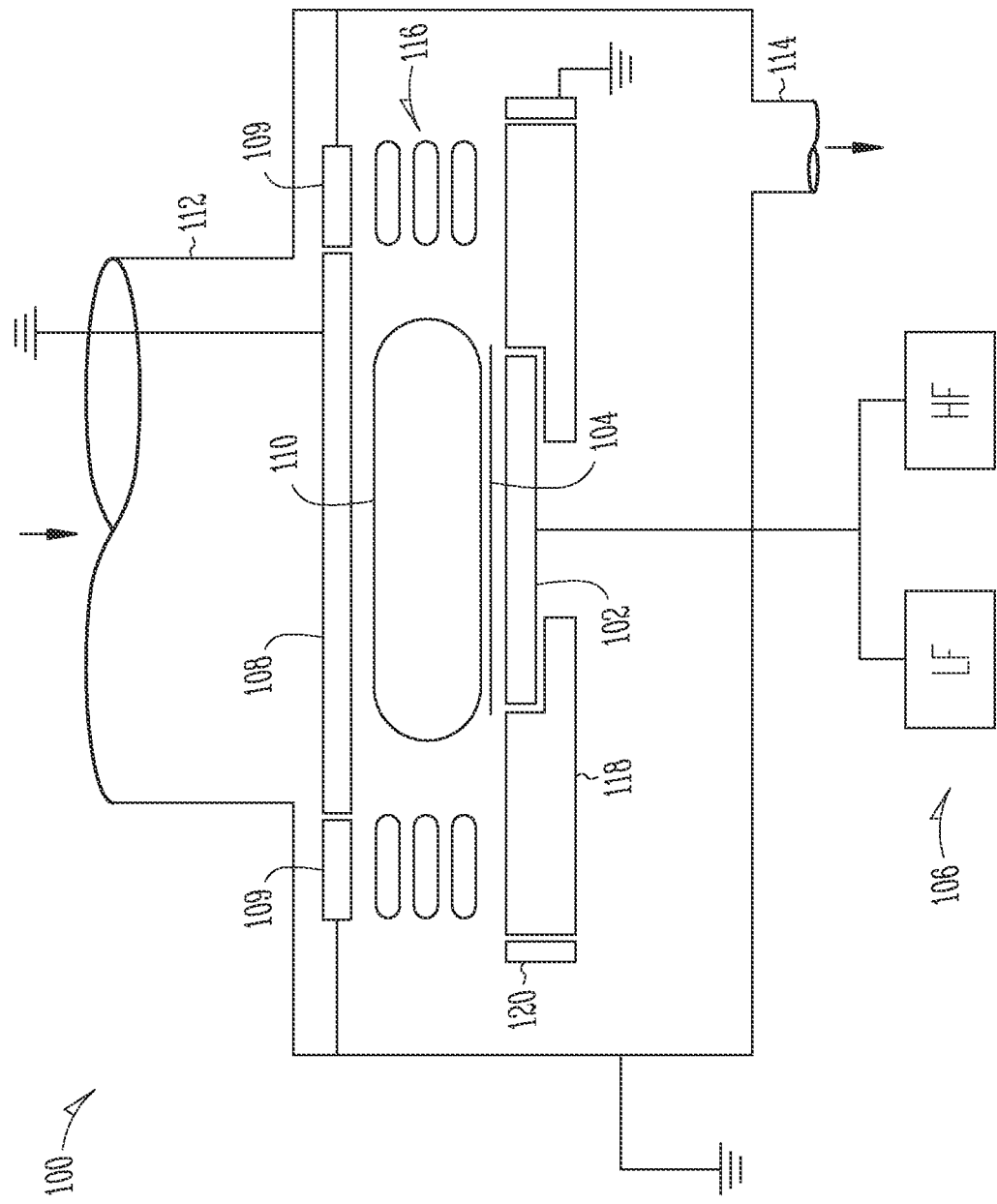
FIG. 1 is a schematic diagram of a reaction chamber within which some embodiments of the present gas distributor may be employed.

The description that follows includes systems, methods, techniques, instruction sequences, and computing machine program products that embody illustrative embodiments of the present subject matter. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2018, All Rights Reserved.

As mentioned further above, a typical plasma etching apparatus comprises a reactor in which there is a chamber through which reactive gas or gases flow. Within the chamber, the gases are ionized into a plasma, typically by radio frequency energy. The highly reactive ions of the plasma gas react with certain materials, such as a polymer mask on a surface of a semiconductor wafer being processed into integrated circuits (IC's). Prior to etching, the wafer is placed in the chamber and held in proper position by a chuck or holder which exposes a top surface of the wafer to the plasma gas.

There are several types of chucks known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present disclosure is applicable to both types of chucks, or other types of chucks.

In semiconductor processing, the etch or deposition rate uniformity across the wafer during each process directly affects the device yield. This has become one of the main qualifying requirements for a process reactor and hence is considered a very important parameter during its design and development. With each increase in the size of wafer diameter, the problem of ensuring uniformity of each batch of ICs from larger and larger wafers becomes more difficult. For instance, with an increase from 200 mm to 300 mm in wafer size and smaller device sizes per wafer, the edge exclusion shrinks to, for example, 2 mm or less. Thus, maintaining uniform etch rates, device profiles, and desired dimensions all the way up to 2 mm or less from the edge of the wafer has become very important.

In a plasma etch reactor, the uniformity of etch parameters (such as etch rate, profile, CD, etc.) is affected by several parameters. One of these parameters is the content and delivery of constituents of the plasma gas. Maintaining uniform gas mixing and distribution upstream of the reactor and providing consistent plasma discharge and chemistry above the wafer has become increasingly important for improving wafer uniformity.

FIG. 1 is a schematic diagram of a reaction chamber within which some embodiments of the present gas distributor may be employed. FIG. 1 illustrates a capacitively-coupled plasma processing chamber 100, representing an exemplary plasma processing chamber of the types typically employed to etch a substrate. The chamber 100 includes a chuck 102, representing the workpiece holder on which a substrate, such as a wafer 104, is positioned during etching. The chuck 102 may be implemented by any suitable chucking technique, e.g., electrostatic, mechanical, clamping, vacuum, or the like. During etching, the chuck 102 is typically supplied with dual RF frequencies (a low frequency and high frequency), for example 2 MHz and 27 MHz, simultaneously, during etching by a dual frequency source 106.

An upper electrode 108 is located above the wafer 104. The upper electrode 108 is grounded. FIG. 1 illustrates an etching reactor where the surface of the upper electrode 108 is larger than the surface of the chuck 102 and the wafer 104. During etching, plasma 110 is formed from etchant source gas supplied via a mixed gas line 112 and pumped out through an exhaust line 114. Within the chamber 100, the mixed gas line 112 may be connected to a showerhead (not shown). The upstream mixing and distribution of gases outside the chamber 100 is discussed in more detail below.

An electrical insulator ring 109 insulates the upper electrode 108 from the grounded chamber 100. Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from the dual-frequency power source 106, equipotential field lines are set up over wafer 104. The equipotential field lines are the electric field lines across the plasma sheath that is between wafer 104 and the plasma 110. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 118 is typically provided to improve process uniformity across the entire wafer surface. With reference to FIG. 1, wafer 104 is shown disposed within a focus ring 118, which may be formed of a suitable dielectric material such as ceramic, quartz, plastic, or the like. Thus, the presence of the focus ring 118 allows the equipotential field lines to be disposed substantially uniformly over the entire surface of the wafer 104.

An electrically conductive shield 120 substantially encircles the focus ring 118. The electrically conductive shield 120 is configured to be substantially grounded within the plasma processing chamber 100. The shield 120 prevents the presence of unwanted equipotential field lines outside of focus ring 118. In relation to the chamber source gas supplied via the mixed gas line 112, it has been found that the gas transport characteristics within the plasma reactor and upstream of it can be the most sensitive variables contributing to etch or deposition non-uniformities.

Conventionally, a gas delivery panel upstream of the mixed gas line 112 is supplied by individual, gas-specific supply lines prior to mixing. These lines can include piping and flow components such as valves, regulators, mass flow controllers (MFCs), and so forth for each gas constituent in a gas mixture. These individual lines typically supply gas to a conventional gas mixing manifold via manifold inlets. The individual gases are mixed in the manifold before leaving the manifold via an exit to be distributed to other components or to a processing chamber (e.g., the processing chamber 100, FIG. 1) via a gas supply line (e.g., a mixed gas line 112, FIG. 1).

A conventional gas mixing manifold or distributor typically includes an elongate, tubular structure of relatively high volume. Each gas supply line for creating a desired gas mixture is spaced a certain distance along the length of the gas manifold. Some manifolds may be up to 27 inches in length, for example. The overall length of a given manifold may be based on the number of gas lines supplying it. The number of gas lines may in turn be dependent on the gas mixture desired for a given process in a processing chamber 100. Gas line hook-up positions are often not consistently provided from manifold to manifold or across different processing chambers 100. Moreover, it will be appreciated that even on a given manifold, some gas line inlet positions will be disposed at greater distances from the manifold exit than others.

The momentum of each gas entering a conventional manifold or distributor may vary considerably due to different gas molecule sizes and flow rates. A fast-flowing, heavy gas in a manifold can affect the flow and entrainment of a slow-flowing gas in unstable ways, possibly due to turbulence and other factors. If a slow-flowing gas inlet is disposed a relatively great distance from a manifold exit, for example, the reaction speed in response to a desired gas-mixture change can be severely inhibited accordingly. The conventional manifold may act in a manner akin to a capacitor with inherent lag times in response to induced changes. Moreover, even if valving effecting a desired gas mixture change operates quickly, the inherent latency of conventional manifold configurations still presents a serious challenge to being able to identify the precise constituents of a given gas mixture as their various flow rates, travel distances, and momentums may be largely unknown.

Further complicating this situation is that without proper control, a gas mixture or flow stability based on an established linear sequence of gas lines supplying a conventional manifold can be disturbed as new gas lines are plugged in or unplugged from the manifold, particularly when supplied at different pressures. For example, gas line positions may change inadvertently or randomly when upstream reservoirs run dry, or when different gas mixtures are desired within a manifold or processing chamber 100. Attempts to control the supply of individual gases into a conventional manifold have included the use of software-controlled valves, but even this has not fully addressed the challenges described above. Wafer etching applications are extremely sensitive to the delivery time of the required mixture to the chamber. Each of the factors described above can significantly affect gas delivery performance, and potential issues caused by response time delay, co-flow inconsistency, and gas mixing delays can detract from wafer uniformity.

In some applications, mixed gas manifolds or distributors as sources of mixed gas may be required to supply a group of process chambers 100 formed in series or parallel arrangements. In other applications, multiple zones, such as center, edge, or middle zones each require a reliable source of gas. The problems discussed above may be exacerbated in view of the different chamber locations and lengths of distribution line to each processing chamber 100 in the group.

Figure 2:
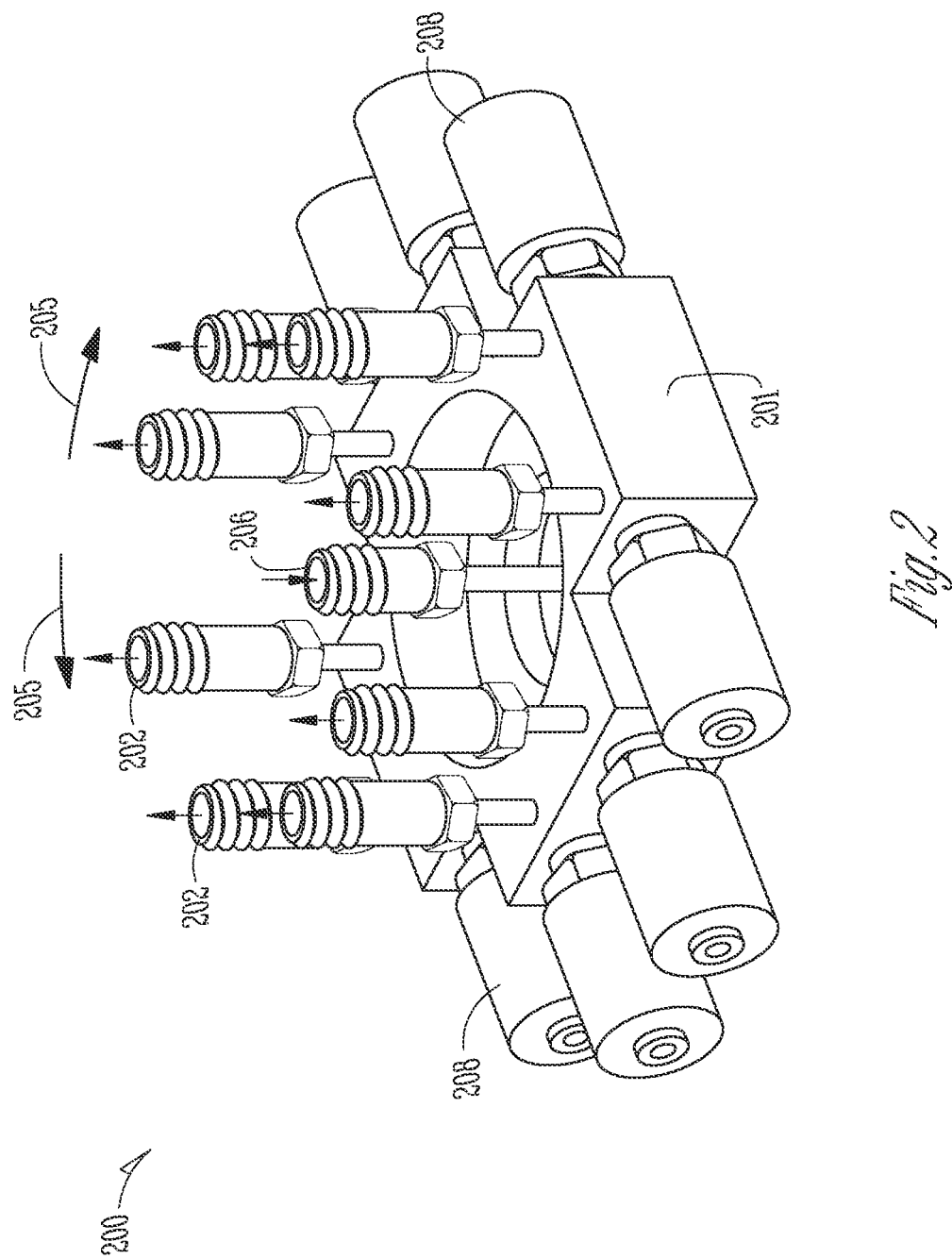
FIG. 2 is a pictorial view of part of a gas distributor, according to an example embodiment.

A pictorial view of a gas distributor sub-assembly 200 is shown in FIG. 2. The sub-assembly 200 includes a body 201 and orbital or orbital array 205 of gas outlets, nozzles or orifices. The outlets may take the form of the illustrated nozzles 202 disposed around a central gas distribution point (or zone) 302 visible in FIG. 3. In some examples, a nozzle 202 may include an orifice specifically designed and sized to regulate gas flow at a predetermined level, as described more fully below. While the term "gas" has been used in this specification, it will be appreciated that the systems and methods described herein may apply to "fluids" more generally unless the context indicates otherwise.

In some examples, the gas distribution point 302 is a localized area or volume having certain dimensions and a central position in relation to an array 205 of gas inlets or outlets, as described further herein. The term "point" is therefore not intended to mean a geometric element having zero dimensions. An example of a central mixed gas distribution point 302 can more clearly be seen in the part-sectional view of the sub-assembly 200 provided in FIG. 3.

Figure 3:
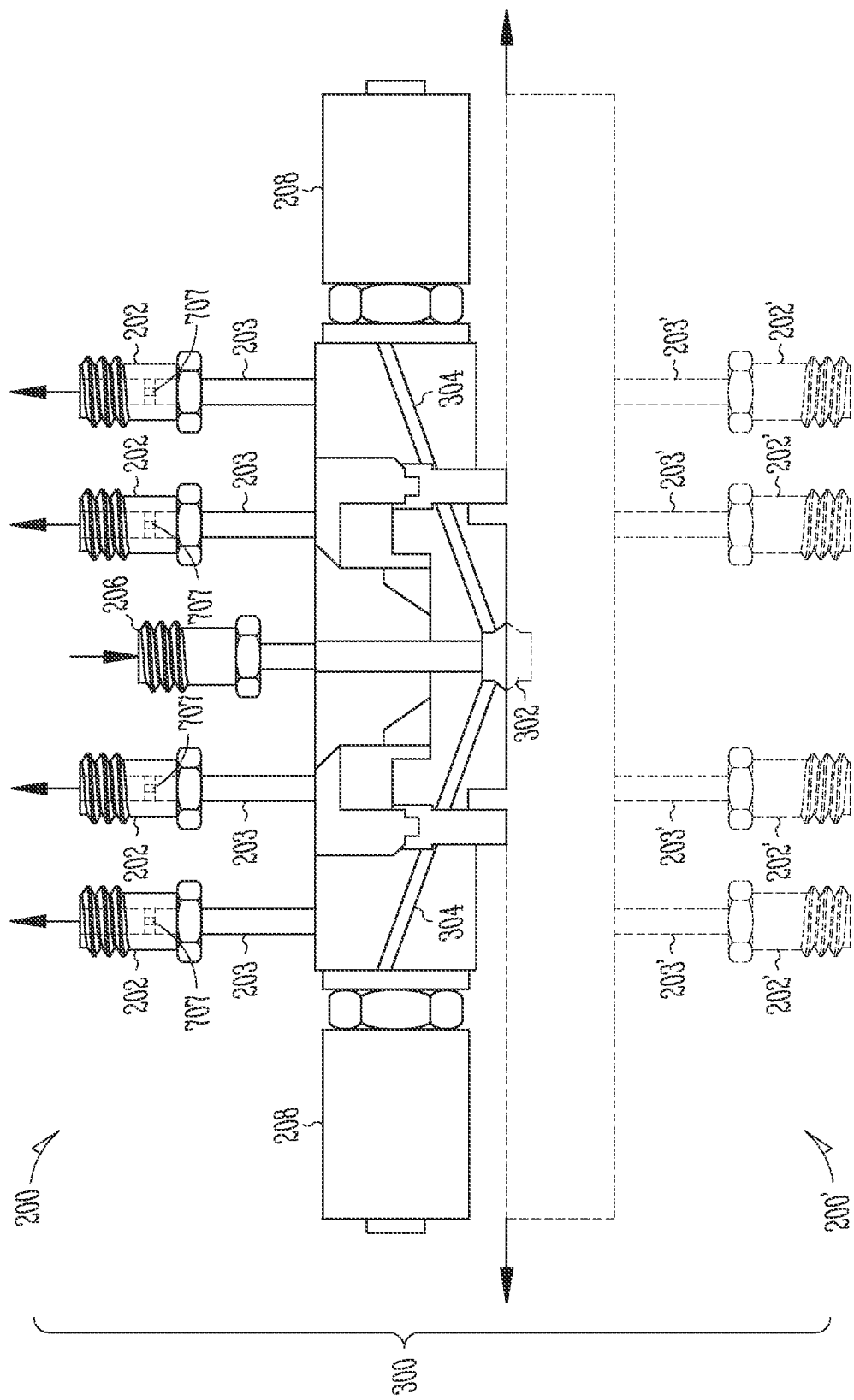
FIG. 3 is a part sectional view of the gas distributor part shown in FIG. 2.

In some examples, the sub-assembly 200 shown in FIGS. 2-3 forms a first half of a gas distributor 300. A complete gas distributor can be formed by joining an opposite or second half to the first half. In some examples, an opposite or second half of the gas distributor is essentially a mirror image of the sub-assembly 200 shown in FIGS. 2-3. This arrangement may be seen in FIG. 3. The second half or opposite sub-assembly is numbered 200'. In some examples, a gas distributor 300 is formed when the two sub-assemblies, or halves, 200 and 200' are assembled together. In assembled form, the central mixed gas distribution point 302 is in fluid communication with a central mixed gas inlet of the gas distributor, such as the illustrated nozzle 206 disposed in the center of the orbital array 205 of outlet nozzles or orifices 202. In some examples, a gas distributor 300 of the present disclosure may be used in place of a conventional gas distributor of the type described above, or in combination with similar or other components in a gas supply system.

In some examples, the gas distributor 300 may operate as a gas mixer such that gas within the distributor is reversed with gas inlets serving as gas outlets, and vice versa. A central gas mixing point is formed by the central gas distribution point. In such an arrangement, a gas distributor can be connected to a gas mixer of the type described just above so that the two, in tandem, can mix and distribute mixed (or homogeneous) gasses to one or more process chambers accordingly to address the disadvantages discussed herein relating to the use of conventional gas manifolds and distributors.

Referring again to FIG. 2, in some examples each of the outlet nozzles 202 can distribute, to downstream locations, single or mixed gas which has been split and combined with gas from other outlet nozzles, for example, to meet a desired ratio between gas supply channels or separated into different streams internally of the gas distributor 300. For example, each of the outlet nozzles 202 shown in the view may be connected to a downstream component or process chamber 100 that requires a source of gas. Eight outlet nozzles 202 are shown connected to the first half of the sub-assembly 200. Other numbers of nozzles are possible. Typically, but not necessarily, the same number of outlet nozzles 202 is provided for the second half of the gas distributor 300, providing sixteen outlet nozzles 202 in total for this particular example. Other numbers of nozzles 202 may be employed depending on a desired capability of the gas distributor 300 to supply (or mix in the alternative gas mixing mode) downstream components or process chambers 100.

Figure 4:
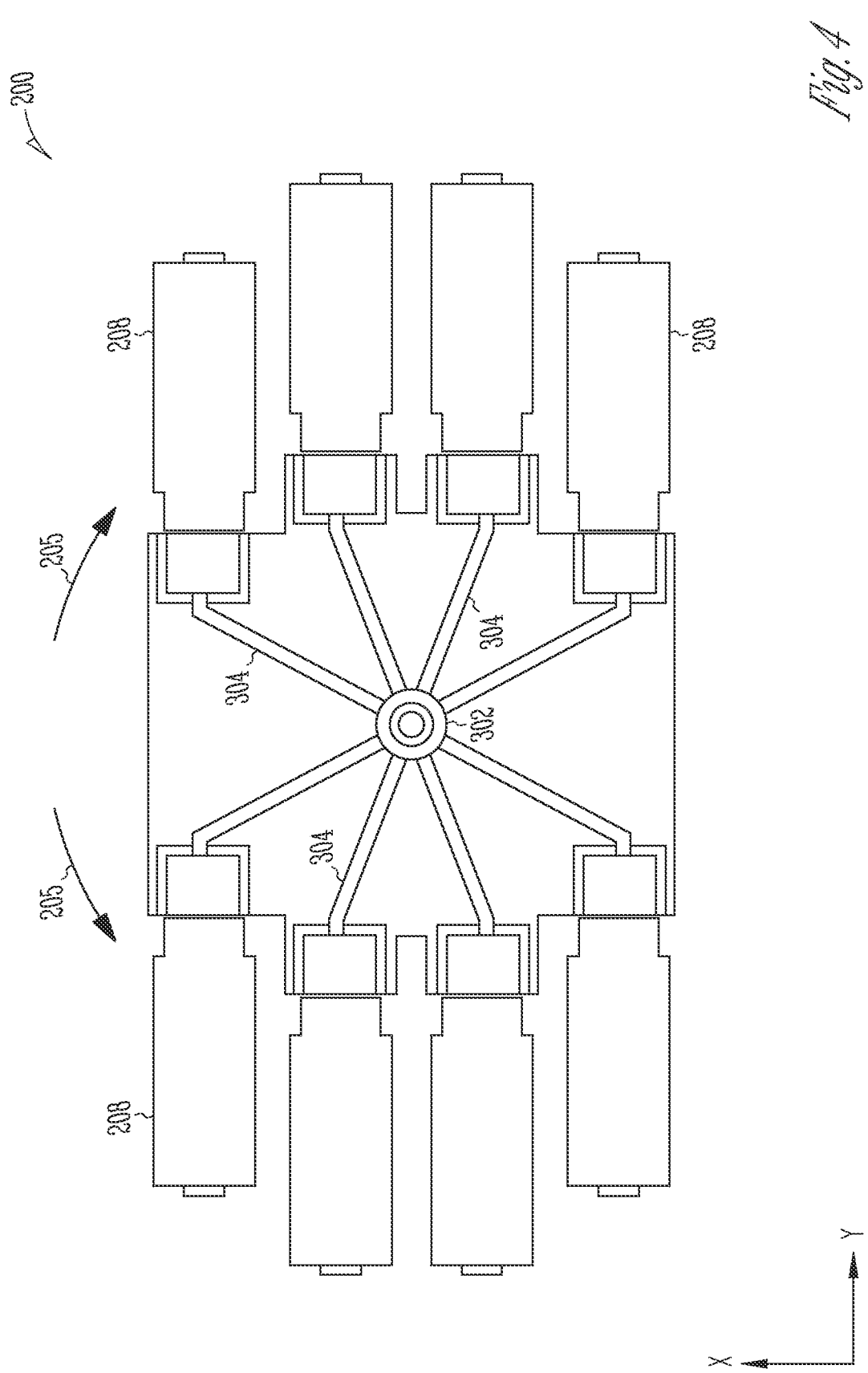
FIG. 4 is a top, part-sectional view of the gas distributor part shown in FIGS. 2-3.
Figure 5:
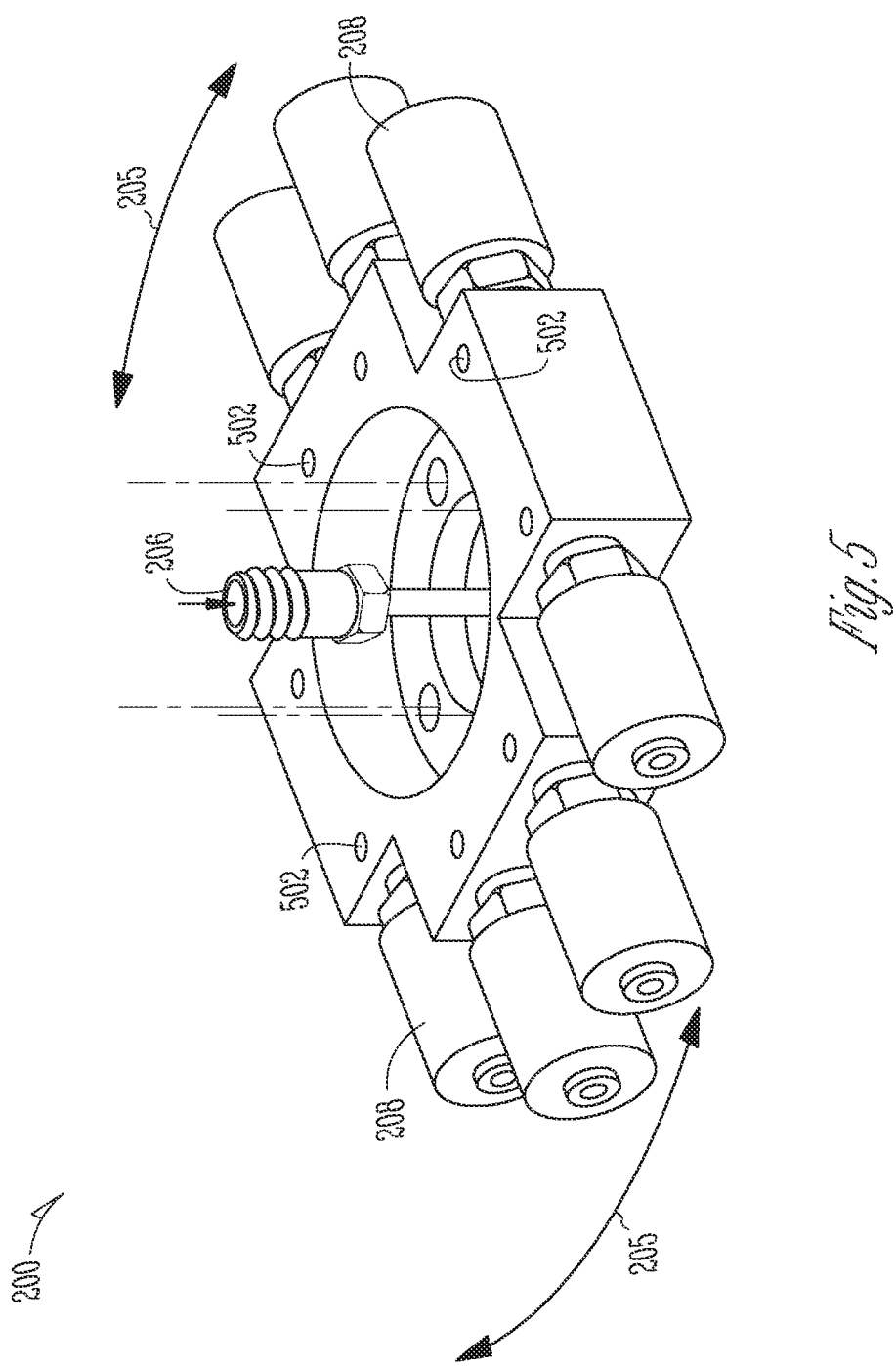
FIG. 5 is a pictorial view of the gas distributor part shown in FIG. 2, with certain parts omitted for clarity.

With reference now to FIG. 3, each outlet nozzle 202 and 202' is shown to be in fluid communication with the central gas distribution point 302 via an internal conduit 304 formed in each subassembly 200 and 200'. Each internal conduit 304 has the same length, or gas pathway, as another. Each control valve 208 and 208' can operate to modulate the amount and rate of flow passing through the internal conduit 304 to create or deliver a desired gas or gas mixture. The internal conduits 304 are also visible in FIG. 4, and gas flow exits for the internal conduits 304 are shown at 502 in FIG. 5. The internal conduits 304 are radially spaced equidistantly, as shown in FIG. 4. The horizontally oriented control valves form an orbital array 205, as shown. In some examples, the gas flow exits 502 may threaded and serve as attachment points for complementary threaded support stems 203 and 203' of the outlet nozzles 202 and 202', respectively. In some examples, the gas flow exits 502 are welded to the gas distributor 300 as stub shafts, or as a C-seal surface mounted fitting.

Referring again to FIG. 3, it will be appreciated that when the first and second subassemblies or halves 200 and 200' of the gas distributor 300 are joined together, the central gas distribution point 302 is defined by a volume that has a substantially ball or spherical shape. This shape is shown in dotted outline in the view. In some examples, the volumetric shape of the central gas distribution point 302 is ovoid or non-spherical in shape. Other shapes are possible such as for example, including a circular, square or rectangular shape in cross section. In some examples, a diameter of the ball, spherical shape, or circular outline is in the range 0.1-100 mm, in some examples in the range 0.5-50 mm, and in some examples 1-10 mm.

It is of note in this disclosure that in some examples the central gas distribution point 302 is equidistant from each of the outlet nozzles 202 and 202'. For this reason, some of the problems discussed above caused by or inherent in a conventional gas mixing or distribution manifold are addressed in the sense that each gas flow path is of the same length and not dependent upon a linear position of an outlet nozzle along an elongate manifold, as in the prior art for example. The travel distance for each gas in a given gas mixture is the same. In the gas mixing mode of the gas distributor, one gas constituent does not impinge upon or interfere with another gas constituent until the central mixing point 302 is reached. The volume of the central gas distribution point 302 is relatively small compared to the volume of a conventional gas manifold having a length of some twenty-seven inches, for example.

Figure 6:
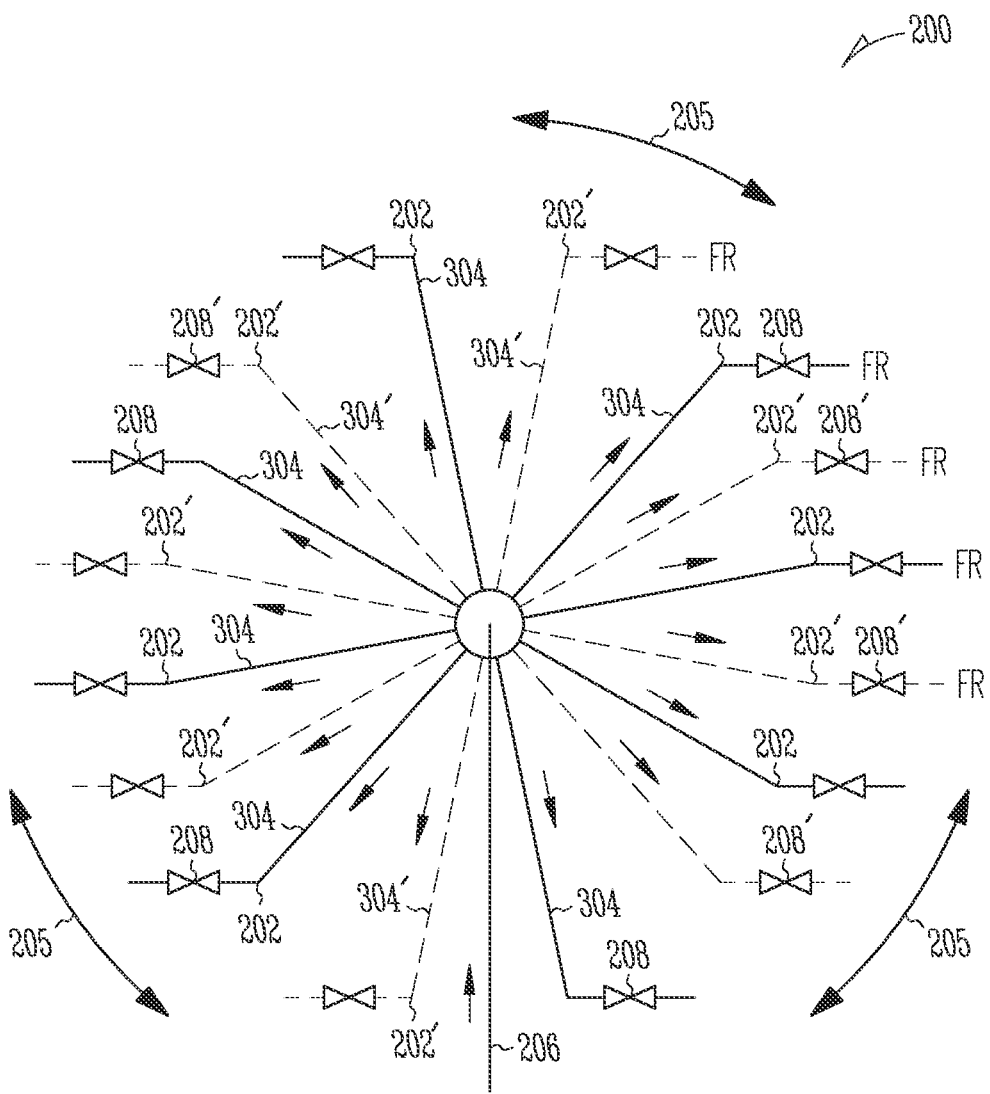
FIG. 6 is a schematic diagram of an orbital array of gas outlet nozzles, in accordance with example embodiments.

An orbital array 205 of the sixteen outlet nozzles 202 is shown in FIG. 6 in schematic form. Outlet nozzles 202 that are connected to the first half (i.e. sub-assembly 200) of the gas distributor 300 have supply lines shown in solid outline and are numbered as 202. Outlet nozzles 202' that are connected to the second half of the gas distributor 300 have supply lines shown in dotted outline and are numbered 202'. Thus, sixteen outlet nozzles are provided in total in this example. Each nozzle 202 and 202' distributes and supplies a desired gas or gas mixture to, for example, a processing chamber 100 (FIG. 1).

It will be appreciated that a gas flowing into the gas distributor 300 is "split" i.e. divided or distributed in proportion to the number of open outlet nozzles 202 and 202' in operation. Some nozzles 202 and 202' may be closed and not in operation. Because the volume of the central gas distribution point is relatively small in relation to conventional gas mixers and distributors, the constituents of a mixed gas are not affected by their journey through the gas distributor 300 and the ratio of the constituents within the mixed gas is substantially maintained. In the gas mixing configuration of the gas distributor 300 discussed further above, for an arrangement having sixteen open inlet nozzles 200 and 200', a mixed gas having up to sixteen gas constituents may be formed. It will be appreciated that the orbital shape of the inlet nozzle array 205 shown by way of example in FIG. 6 may in some examples not be entirely or perfectly orbital. A degree of ovality or other circular shapes may be used in some examples.

In some examples, a control valve 208 is provided in fluid communication with each outlet nozzle 202 and 202'. An array 205 of control valves 208 serves to distribute the respective mass flow rates of gas exiting the gas distributor 300 via the outlet nozzles 202 and 202', or the constituents of a mixed gas being formed by the gas distributor 300 in its gas mixing configuration. The respective control valves 208 are likewise alternately labelled 208 and 208' in FIG. 6 and the individual and respective gas flow rates are labelled FR in the same view, indicating a flow restriction in the exiting gas. Gas flow through the outlet nozzles 202 and 202' can be controlled using the control valves 208 and 208' and verified in some examples using associated measuring equipment.

In some examples, the gas distributor 300 can also operate as a gas flow rate verifier or regulator in distributing gas. For example, a gas flow to be measured (Q) may be routed through an appropriately-sized orifice sized to ensure supersonic flow across orifice. Under supersonic flow conditions, gas flow $Q=KP_1$ where (K) is a gas-dependent constant and ($P_1$) is an upstream pressure. The upstream pressure ($P_1$) may be measured with a high accuracy digital capacitance manometer. The gas-dependent constant (K) is weakly temperature dependent and may be empirically determined using an independent methodology. Thus, for a given orifice size, for example the orifice of an outlet nozzle 202 or 202', the flow (Q) of a gas through that outlet nozzle 202 or 202' can be verified (i.e. is calculable or assured) for a given upstream pressure ($P_1$), for example the pressure in the central gas distribution point 302 which may be measured by a manometer in some examples.

Figure 7B:
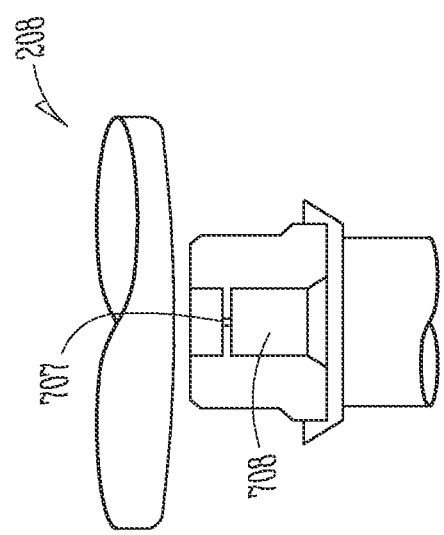
FIGS. 7A-7B show aspects of a gas outlet which includes a "flow rate" orifice for restricting or verifying gas flow exiting the gas distributor, in accordance with example embodiments.
Figure 7A:
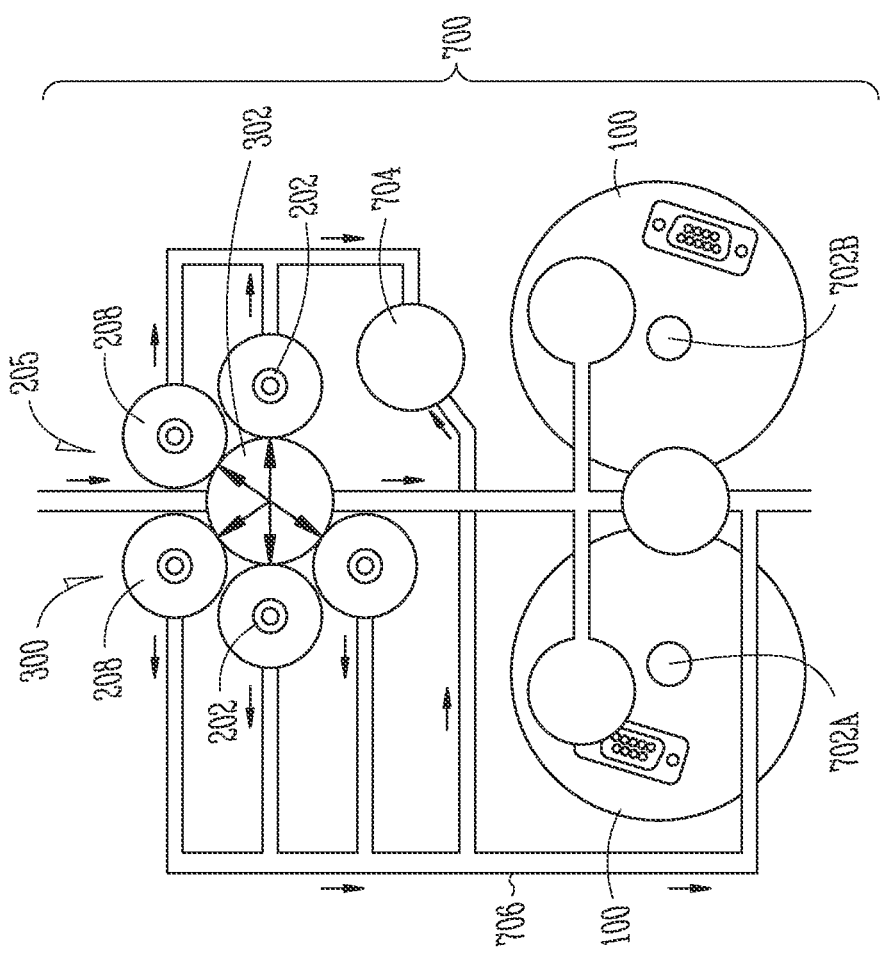

With reference now to FIGS. 7A-7B, a schematic top view of a gas flow verifier 300 is shown. The gas flow verifier 300 includes a central gas distribution point 302. The gas flow verifier 300 includes an orbital array 205 of vertically oriented control valves 208 that surround the central gas distribution point 302. Each control valve 208 includes a representative gas outlet 202, as shown. The gas flow verifier 300 is included in a gas distribution arrangement 700 which includes a pair of manometers 702A and 702B, and a third manometer 704.

A series of interconnected gas pathways or conduits 706 places the control valves 208 and the manometers 702A, 702B, and 704 in fluid communication with each other. In the illustrated gas distribution arrangement 700, the manometer 704 measures the pressure of gas exiting the gas outlets 202 of the two control valves 208 on the right side of the gas flow verifier 300, in the view. The pair of manometers 702A and 702B measure similarly for the three gas outlets 202 of the three control valves 208 on the left side of the gas flow verifier 300, in the view. The illustrated manometers can be used to measure and verify the flow of gas through the gas flow verifier 300 and, in some examples, through each of the particular gas outlets 202 thereof. In some examples, a gas pressure measured by a manometer 702A, 702B, or 704 is converted to an actual flow using certain gas look-up tables. A gas flow error can be calculated and displayed on a user interface display for example. System software may include specific gas tables to calculate a gas flow error applicable to the use of specific gasses. In some examples, a gas table contains a pressure-to-flow rate relationship for a chosen gas at the location of one or more orifices installed in the gas flow verifier 300. In some examples, one or more measurements may be taken of a gas pressure rate increase compared to a corresponding predicted pressure as defined in the appropriate lookup gas table. A measured time to reach a stable pressure is a function of the molecular weight of the gas and the gas (or MFC) flow.

The flow of gas through each of the control valves 208 may in some examples be regulated by an orifice 707 (or "flow rate orifice") which can be seen more clearly in the sectional schematic view of a control valve 208 shown in FIG. 7B. In accordance with the gas flow equations described further above, for example, an orifice 707 can be designed and sized to permit or control the flow of gas through a control valve 208 at a desired or specified or predetermined gas or mass flow rate. Thus, for example, if each of the orifices 707 in each of the illustrated control valves 208 is equally sized then, for a given upstream pressure, the flow of gas through each control valve 208 (and consequently through each gas outlet 202) will be the same. In this way, a gas flow verifier of the present disclosure can distribute (split) and supply gas equally to downstream components. Alternatively, by sizing each orifice 707 appropriately and differently for each gas outlet or nozzle 202, respective and different desired or predetermined flow rates of distributed gas can be established for each outlet 202 while at the same time distributing gas to the same number of desired components located downstream of the gas flow verifier 300. Example downstream components may include one or more wafer processing chambers 100.

In some examples, an orifice 707 can be included in a replaceable or interchangeable part 708 in FIG. 7B. The interchangeable part 708 may be positioned within or under a surface mounted control valve 208, for example. Other arrangements are possible, for example as shown in schematic dotted outline in FIG. 3 in which an example orifice 707 is provided directly within a gas outlet or nozzle 202 in the gas flow path of gas exiting the gas flow verifier 300. An orifice 707 may be provided in all or a selected number of the outlets 202 in some examples.

A series of interchangeable parts 708 each including a specifically sized orifice 707 is provided in some examples so that gas flow rates from all of the gas outlets 202 can be adjusted conveniently. In other examples, specific and different gas flow rates for individual gas outlets 202 can be established in a convenient manner. In some examples, a gas flow verifier 300 conveniently serves as a dual function device which can operate in two modes simultaneously, namely proportionately splitting and distributing gas in one mode, while restricting or verifying gas flow in another. In essence, the same hardware of the gas flow verifier 300 is able to perform two functions at the same time. Thus, a gas flow verifier 300 of the present disclosure is highly configurable to suit specific and varying conditions and gas flow requirements within a semiconductor manufacturing system, accordingly.

Figure 8A:
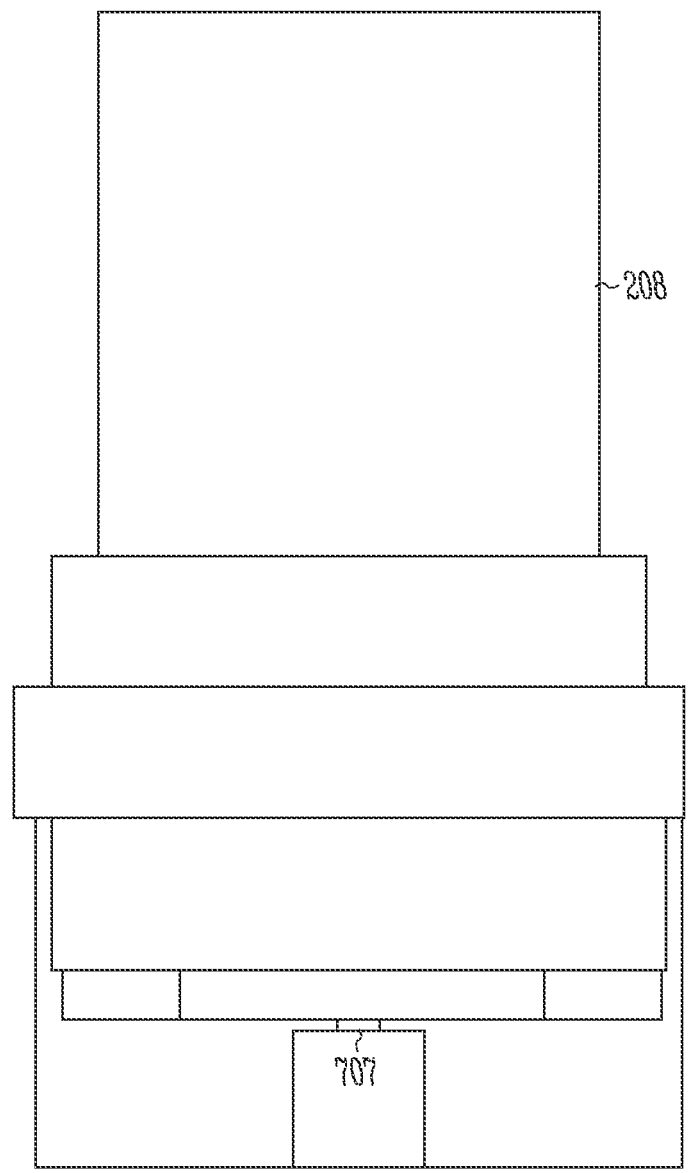
FIGS. 8A-8C show aspects of a gas outlet which includes a "flow rate" orifice for restricting or verifying gas flow exiting the gas distributor, in accordance with example embodiments.
Figure 8C:
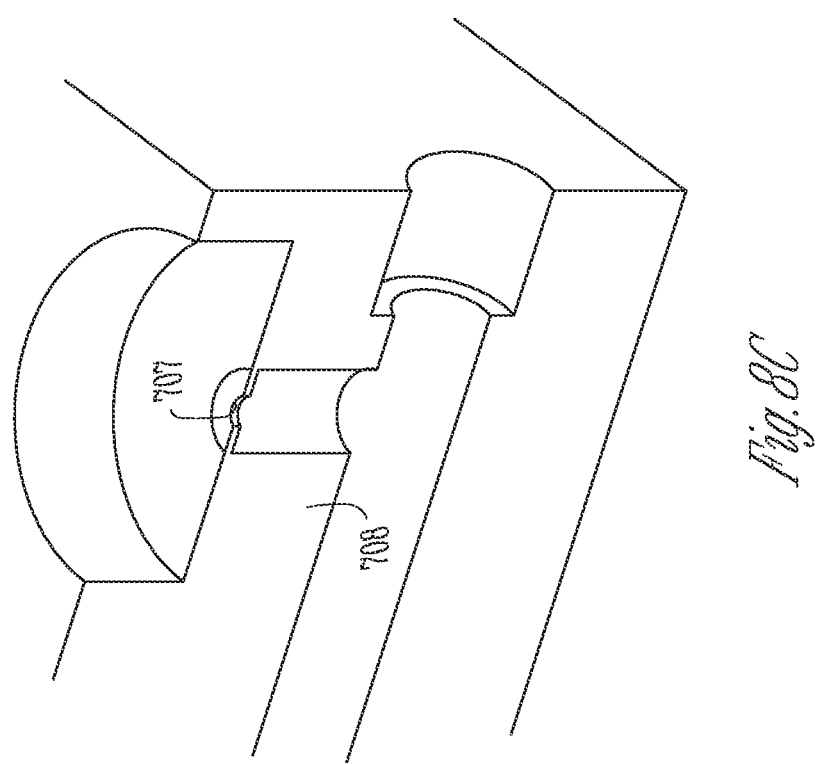
Figure 8B:
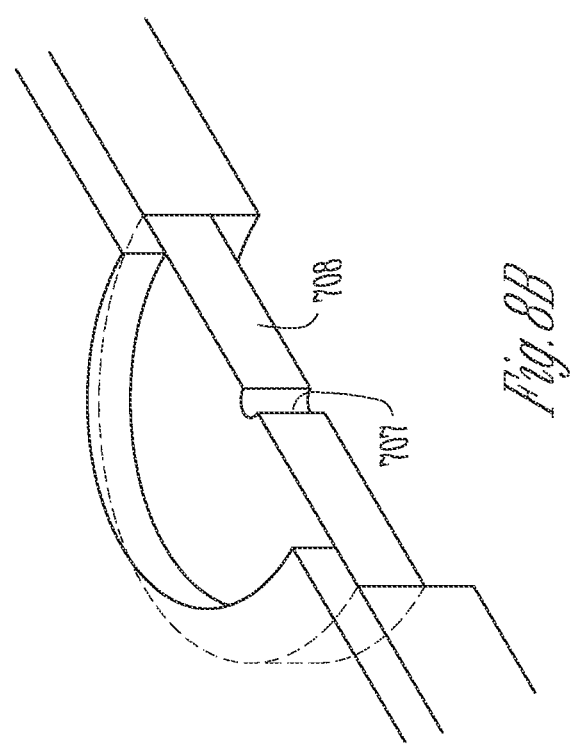

In other examples, with reference now to FIGS. 8A-8C, an orifice 707 may be directly or indirectly embedded in a control valve 208 and calibrated at a factory, for example, in the manner described above to permit or regulate a desired or predetermined gas flow through a control valve 208 to which it is fitted. FIGS. 8B-8C show alternate configurations for providing an orifice 707 and FIG. 8C for example shows an alternate form of a replacement part 708.

Figure 9:
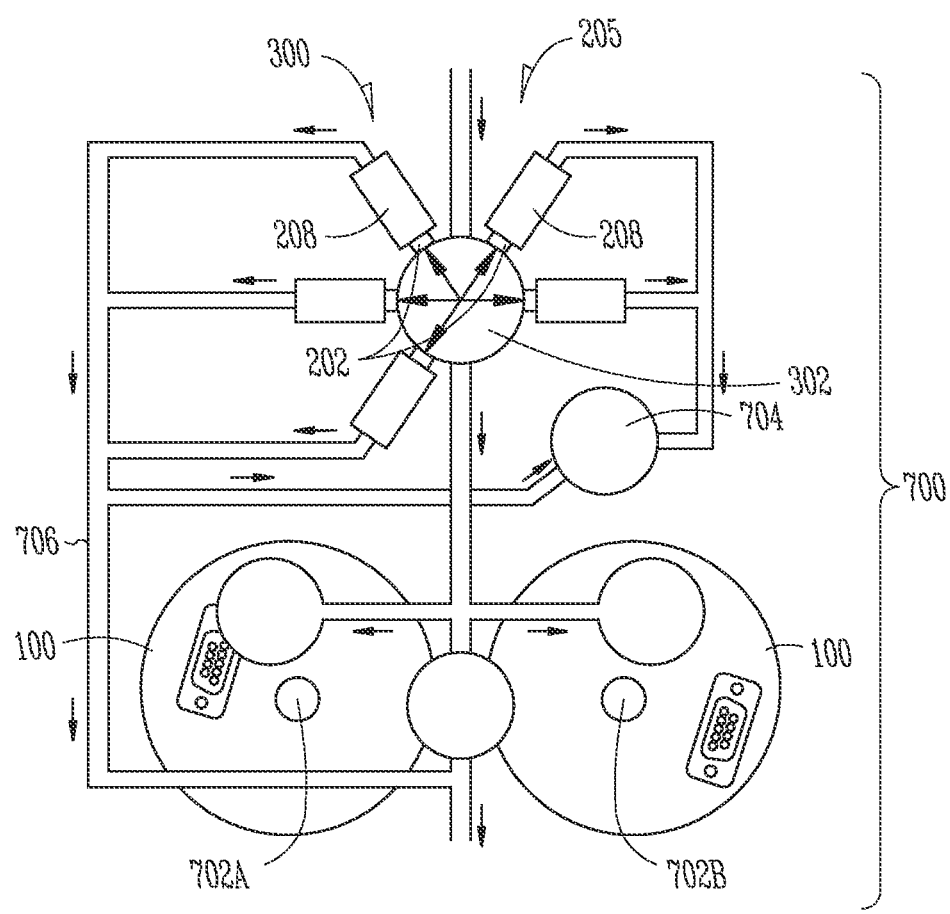
FIG. 9 shows aspects of a gas outlet which includes a "flow rate" orifice for restricting or verifying gas flow exiting the gas distributor, in accordance with example embodiments.

With reference now to FIG. 9, and alternate configuration of a gas flow verifier 300 is illustrated. In this instance, the control valves 208 are oriented horizontally and again form an orbital array 205. Similar parts corresponding to those shown in FIG. 7A are labeled accordingly.

Further configurations of the gas flow verifier 300, and the gas distribution arrangement 700, are possible. In some examples, the manometers 702A-702B and 704 that form part of the gas distribution system 700 serve to verify gas flow through the gas pathways or conduits 706, and more particularly verify or determine a choked condition of a gas outlet 202 or orifice 707. The manometers 702A-702B and 704 can measure and verify the gas flow that is being delivered by the gas flow verifier 300, at a point in time or over a period of time.

In some example embodiments of a gas distributor or gas flow verifier 300 described herein, a relatively negligible volume of the gas distribution point 302 when compared with the relatively large volume of a conventional gas mixing or distribution manifold can significantly reduce mixture delay or lag time which would otherwise be induced in the prior art systems. Gas flow rate regulation in accordance with the present disclosure can be performed in a large range of gas flows, for example 0.5 sccm to 5000 sccm, with ±0.5% error.

Figure 10:
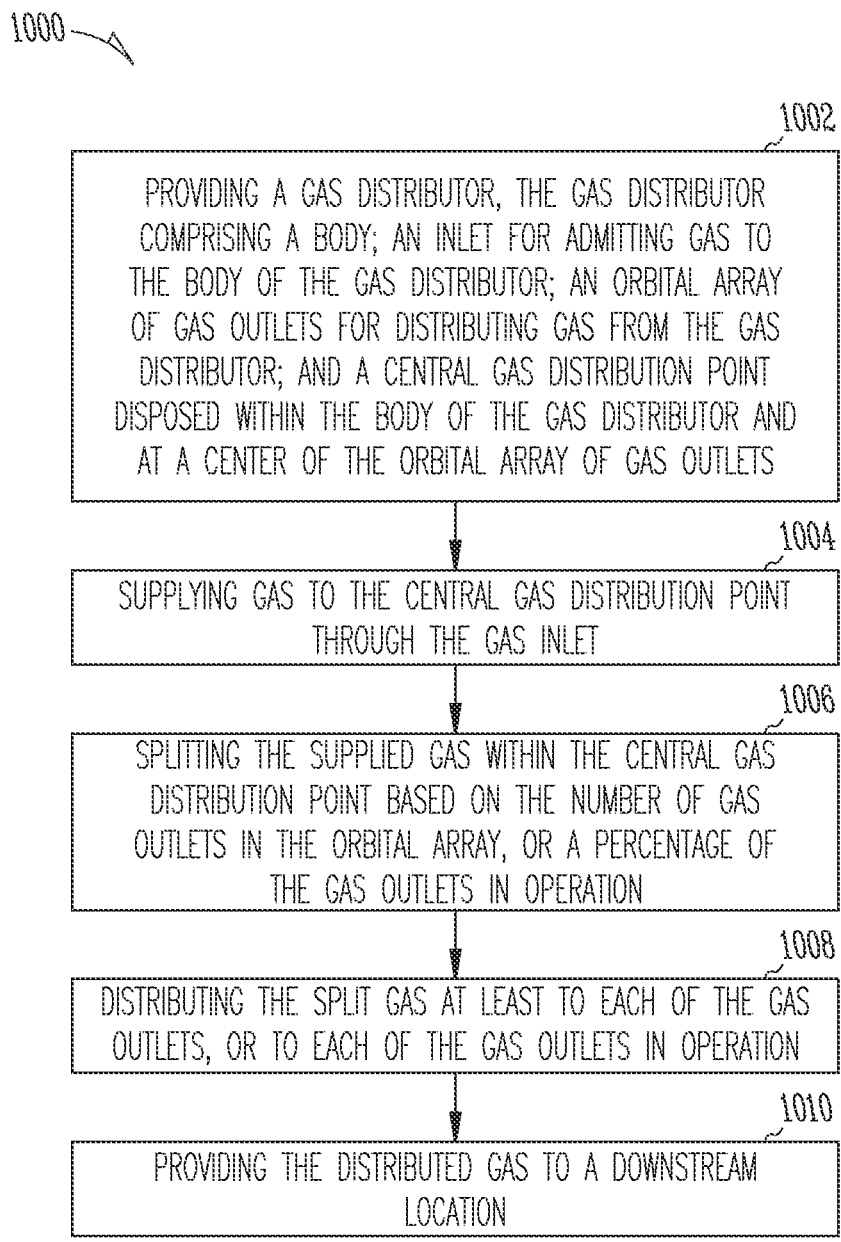
FIG. 10 is a flow chart showing operations in a method for distributing gases, according to an example embodiment.

The present disclosure also includes example methods. With reference to FIG. 10, a method 1000 of distributing gas includes, at operation 1002, providing a gas distributor, the gas distributor comprising a body; an inlet for admitting gas to the body of the gas distributor; an orbital array of gas outlets for distributing gas from the gas distributor; and a central gas distribution point disposed within the body of the gas distributor and at a center of the orbital array of gas outlets; at operation 1004, supplying gas to the central gas distribution point through the gas inlet; at operation 1006, splitting the supplied gas within the central gas distribution point based on the number of gas outlets in the orbital array, or a percentage of the gas outlets in operation; at operation 1008, distributing the split gas at least to each of the gas outlets, or to each of the gas outlets in operation; and, at operation 1010, providing the distributed gas to a downstream location.

In some examples, the method 1000 further comprises distributing the split gas to the gas outlets through internal gas conduits formed in the body of the gas distributor, the internal gas conduits connecting the orbital array of gas outlets to the central gas distribution point.

In some examples, the method 1000 further comprises distributing the split gas along respective gas flow paths of the internal gas conduits from the central gas distribution point to the gas outlets, the respective gas flow paths being equal in length.

In some examples, the method 1000 further comprises providing, in association with each gas outlet, an orifice sized to permit or regulate a specific flow of gas through the respective gas outlet.

In some examples, the method 1000 further comprises providing, within the body of the gas distributor and for the central gas distribution point, a volume of substantially spherical shape, or a sectional outline of substantially orbital shape.

In some examples, a non-transitory machine-readable medium includes instructions 1124 that, when read by a machine 1100, cause the machine to control operations in methods comprising at least the non-limiting example operations summarized above.

FIG. 11 is a block diagram illustrating an example of a machine 1100 upon which one or more example process embodiments described herein may be implemented, or by which one or more example process embodiments described herein may be controlled. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in a peer-to-peer (P2P) (or other distributed) network environment. Further, while only a single machine 1100 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1100 may include a hardware processor 1102 (e.g., a central processing unit (CPU), a hardware processor core, or any combination thereof), a graphics processing unit (GPU) 1103, a main memory 1104, and a static memory 1106, some or all of which may communicate with each other via an interlink (e.g., bus) 1108. The machine 1100 may further include a display device 1110, an alphanumeric input device 1112 (e.g., a keyboard), and a user interface (UI) navigation device 1114 (e.g., a mouse). In an example, the display device 1110, alphanumeric input device 1112, and UI navigation device 1114 may be a touch screen display. The machine 1100 may additionally include a mass storage device (e.g., drive unit) 1116, a signal generation device 1118 (e.g., a speaker), a network interface device 1120, and one or more sensors 1121, such as a Global Positioning System (GPS) sensor, compass, accelerometer, or another sensor. The machine 1100 may include an output controller 1128, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 1116 may include a machine-readable medium 1122 on which is stored one or more sets of data structures or instructions 1124 (e.g., software) embodying or utilized by any one or more of the techniques or functions described herein. The instructions 1124 may also reside, completely or at least partially, within the main memory 1104, within the static memory 1106, within the hardware processor 1102, or within the GPU 1103 during execution thereof by the machine 1100. In an example, one or any combination of the hardware processor 1102, the GPU 1103, the main memory 1104, the static memory 1106, or the mass storage device 1116 may constitute machine-readable media 1122.

While the machine-readable medium 1122 is illustrated as a single medium, the term "machine-readable medium" may include a single medium, or multiple media, (e.g., a centralized or distributed database, and/or associated caches and servers) configured to store the one or more instructions 1124.

The term "machine-readable medium" may include any medium that can store, encoding, or carrying instructions 1124 for execution by the machine 1100 and that cause the machine 1100 to perform any one or more of the techniques of the present disclosure, or that can store, encoding, or carrying data structures used by or associated with such instructions 1124. Non-limiting machine-readable medium examples may include solid-state memories, and optical and magnetic media. In an example, a massed machine-readable medium comprises a machine-readable medium 1122 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 1124 may further be transmitted or received over a communications network 1126 using a transmission medium via the network interface device 1120.

Although an embodiment has been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

What is claimed is:

1. A gas mixer comprising:
    a body;
    an orbital array of gas inlets for receiving one or more constituents of a mixed gas;
    a mixed gas outlet for emitting a mixed gas from the body, the mixed gas outlet disposed at a center of the orbital array of gas inlets;
    a central gas mixing point, separate from the mixed gas outlet, the central gas mixing point comprising an internal volume disposed within the body and surrounded by the orbital array of gas inlets, the internal volume being in fluid communication with the orbital array of gas inlets via a corresponding array of gas pathways extending from the internal volume to each of the gas inlets, and wherein gas path lengths of the gas pathways are the same; and control circuitry in fluid communication with the internal volume, the control circuitry configured to individually control gas flow rate within each of the gas pathways.

2. The gas mixer of claim 1, wherein the orbital array of gas inlets are radially spaced equidistantly around the central gas mixing point.

3. The gas mixer of claim 1, wherein the body includes internal gas conduits connecting the central gas mixing point to the orbital array of gas inlets.

4. The gas mixer of claim 3, wherein respective gas flow paths of the internal gas conduits from the central gas mixing point to the orbital array of gas inlets are equal in length.

5. The gas mixer of claim 1, wherein each gas inlet includes an orifice sized to permit or regulate a predetermined flow of a mixed gas constituent flowing through that gas inlet.

6. The gas mixer of claim 5, wherein the body includes mounting locations for respective control valves or nozzles to permit or regulate predetermined flows of gas entering the gas inlets.

7. The gas mixer of claim 6, wherein the control circuitry further comprises control valves or nozzles each mounted at a respective mounting location among the mounting locations so that each inlet is provided a respective control means for controlling a gas flow through the inlet, wherein each of the control valves or nozzles includes an orifice.

8. The gas mixer of claim 6, further comprising the control valves or nozzles.

9. The gas mixer of claim 8, wherein the control valves or nozzles are interchangeable.

10. The gas mixer of claim 8, wherein the control valves or nozzles are configured in a same plane.

11. The gas mixer of claim 8, wherein an orifice associated with a first control valve or nozzle is sized differently from an orifice associated with a second control valve or nozzle.

12. The gas mixer of claim 1, wherein the internal volume of the central gas mixing point includes a volume of spherical shape.

13. The gas mixer of claim 1, further comprising:
one or more manometers to measure or verify gas flow of the gas flowing through the orbital array of gas inlets or mixed gas outlet.

14. The gas mixer of claim 1, wherein the body includes two components which define a parting line between them, wherein the internal volume is disposed at the parting line of the two components wherein a first one of the two components defines a first wall of the internal volume, and a second one of the two components defines a second wall of the internal volume.

15. A method of mixing gas comprising:
providing a gas mixer, the gas mixer comprising:
a body;
an orbital array of gas inlets for receiving one or more constituents of a mixed gas;
a mixed gas outlet for emitting a mixed gas from the body, the mixed gas outlet disposed at a center of the orbital array of gas inlets;
a central gas mixing point, separate from the mixed gas outlet, the central gas mixing point comprising an internal volume disposed within the body and surrounded by the orbital array of gas inlets, the internal volume being in fluid communication with the orbital array of gas inlets via a corresponding array of gas pathways extending from the internal volume to each of the gas inlets, and wherein gas path lengths of the gas pathways are the same; and
control circuitry in fluid communication with the internal volume, the control circuitry configured to individually control gas flow rate within each of the gas pathways;
supplying gas constituents to the central gas mixing point through the gas inlets;
mixed the supplied gas constituents within the central gas mixing point based on a number of open gas inlets in the orbital array, or a percentage of the gas inlets in operation;
distributing the mixed gas to the mixed gas outlet; and
providing the mixed gas to a downstream location.

16. The method of claim 15, further comprising:
distributing the mixed gas constituents to the central gas mixing point through internal gas conduits formed in the body, the internal gas conduits connecting the orbital array of gas inlets to the central gas mixing point.

17. The method of claim 16, wherein:
respective gas flow paths of the internal gas conduits are equal in length.

18. The method of claim 15, further comprising:
providing, in association with each gas inlet, an orifice sized to permit or regulate a predetermined flow of gas going through that gas inlet.

19. The method of claim 15, wherein the gas mixer further comprises control valves or nozzles.

20. The method of claim 19, wherein each of the control valves or nozzles includes one or more orifices, wherein an orifice associated with a first control valve or nozzle is sized differently from an orifice associated with a second control valve or nozzle.

* * * * *